(12) United States Patent
Chen

(10) Patent No.: US 7,755,427 B2
(45) Date of Patent: Jul. 13, 2010

(54) OPERATIONAL AMPLIFIER AND RELATED METHOD OF ENHANCING SLEW RATE

(75) Inventor: Ji-Ting Chen, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 1 day.

(21) Appl. No.: 12/268,403

(22) Filed: Nov. 10, 2008

(65) Prior Publication Data

US 2009/0278604 A1 Nov. 12, 2009

(30) Foreign Application Priority Data

May 6, 2008 (TW) .............................. 97116659 A

(51) Int. Cl.
*H03F 3/45* (2006.01)

(52) U.S. Cl. ...................... 330/261; 330/257; 330/253; 330/296

(58) Field of Classification Search ................. 330/261, 330/257, 253, 296
See application file for complete search history.

(56) References Cited

U.S. PATENT DOCUMENTS

| | | | | |
|---|---|---|---|---|
| 5,471,171 A | * | 11/1995 | Itakura et al. ............... 330/253 |
| 6,051,999 A | * | 4/2000 | To et al. ....................... 327/66 |
| 6,577,185 B1 | * | 6/2003 | Chandler et al. ............... 330/9 |
| 6,600,483 B1 | * | 7/2003 | Akita et al. .................. 345/204 |
| 7,339,402 B2 | * | 3/2008 | Alenin et al. ................ 326/109 |
| 7,348,812 B2 | * | 3/2008 | Ikezawa ...................... 327/131 |
| 7,495,511 B2 | * | 2/2009 | Gilbert et al. ................ 330/254 |

* cited by examiner

*Primary Examiner*—Patricia Nguyen
(74) *Attorney, Agent, or Firm*—Winston Hsu

(57) ABSTRACT

An operational amplifier capable of enhancing slew rate is disclosed. The operational amplifier includes a first current generator for generating a first bias current, a second current generator for generating a second bias current, an amplification stage, coupled to the first current generator, for generating a amplification signal according to an input signal, an output stage, coupled to the second current generator and the amplification stage, for generating an output signal according to the amplification signal, and a bias current allocation unit, coupled to the first current generator, the second current generator, the amplification stage and the output stage, for reallocating current intensities of the first bias current and the second bias current according to a control signal.

22 Claims, 8 Drawing Sheets

OPERATIONAL AMPLIFIER AND RELATED METHOD OF ENHANCING SLEW RATE

BACKGROUND OF THE INVENTION

1. Field of the Invention

The present invention relates to an operational amplifier and related method of enhancing slew rate, and more particularly, to an operational amplifier and related method that reallocates current intensities of an amplification stage bias current and an output stage drive current to increase drive capability of the amplification stage circuit.

2. Description of the Prior Art

An operational amplifier is a widely used element for realizing a variety of circuit functions. Taking driving circuits of a liquid crystal display (LCD) as an example, the operational amplifier can be used as an output buffer, which charges or discharges loads, i.e. liquid crystals, according to analog signals outputted by a front stage digital to analog converter (DAC), for driving corresponding pixel units on the LCD. However, with increases in size and resolution of the LCD, data quantity processed by the driving circuits is also increasing significantly, so that response speed of the operational amplifier, also called slew rate, has to be enhanced as well.

In a conventional driver chip, the operational amplifier generally has a two-stage structure, which includes a first stage amplification circuit (amplification stage) and a second stage output circuit (output stage). The first stage amplification circuit is utilized for increasing current or voltage gain of the operational amplifier, while the second stage output circuit is utilized for driving capacitive or resistive loads connected to the operational amplifier. In addition, since the operational amplifier may suffer loop instability problems, Miller compensation capacitors are commonly used to perform frequency compensation for improving loop stability.

Please refer to FIG. 1. FIG. 1 is a schematic diagram of a conventional operational amplifier 100. For brevity, the operational amplifier 100 is an operational amplifier with a simplest circuit structure, and merely has an N-type input differential pair. The operational amplifier 100 mainly includes an amplification stage circuit 110, an output stage circuit 120, a first bias current source 115 and a second bias current source 125. The amplification stage circuit 110 is formed by transistors MP1, MP2, MN1 and MN2. The output stage circuit 120 is formed by a transistor MPO that has a common emitter configuration. The first bias current source 115 and the second bias current source 125 are utilized for providing fixed static currents (or driving currents) $IT_1$ and $IT_2$ for the amplification stage circuit 110 and the output stage circuit 120, respectively. Furthermore, an output terminal Vout of the output stage circuit 120 is further coupled to an input terminal AVN of the amplification stage circuit 110 for forming an output buffer with unit gain and negative feedback. In addition, a compensation capacitor $C_M$ is coupled between an output terminal of the amplification stage circuit 110, i.e. a drain of the transistor MN2, and the output terminal Vout of the output stage circuit 120, and is utilized for performing pole-splitting for output signals of the amplification stage circuit 110 and the output stage circuit 120, so as to enhance loop stability. Detailed operation of the operational amplifier 100 is well-known by those skilled in the art, and not narrated herein.

Specifically, the response speed of the operational amplifier 100 is decided by the bias currents of the amplification stage circuit and the output stage circuit. However, in order to drive external loads of the operational amplifier 100, the output stage drive current is generally greater than the amplification stage bias current. In this case, when the operational amplifier drives a heavy load, the response speed is often restricted by the bias current of the amplification stage circuit.

Please refer to FIG. 2. FIG. 2 illustrates an internal current path of the operational amplifier 100 when an input signal of the operational amplifier 100 is converted from low to high. Since a voltage level of the input terminal AVP is raised immediately when the input signal of the operational amplifier 100 is converted, the transistors MN1, MP1 and MP2 are then switched off, so that the first bias current source 115 can only draw the bias current $IT_1$ from the compensation capacitor $C_M$ through the transistor MN2 for pulling up the voltage level of the output terminal Vout. The above current path is shown as PATH_1 in FIG. 2. On the other hand, please refer to FIG. 3, which illustrates an internal current path of the operational amplifier 100 when the input signal of the operational amplifier 100 is converted from high to low. Since the voltage level of the input terminal AVP is dropped immediately when the input signal is converted, the transistor MN2 is then switched off, so that the bias current $IT_1$ is drawn entirely through the transistor MN1. Additionally, since the transistors MP1 and MP2 have a current mirror structure, a current with intensity the same as the bias current $IT_1$ also simultaneously flows to the ground through the compensation capacitor $C_M$, so as to pull down the voltage level of the output terminal Vout. The above current path is shown as PATH_2 in FIG. 3.

Thus, it can be seen that the response speed of the operational amplifier 100 depends on how fast the bias current $IT_1$ of the amplification stage circuit charges or discharges the compensation capacitor $C_M$, and can be expressed by the following slew rate equation:

$$SR = \frac{I_{T1}}{C_M} = \frac{\Delta V}{t}.$$

Thus, if the amplification stage bias current increases, the compensation capacitor can be charged or discharged much faster, so that the response speed of the operational amplifier 100 can be enhanced.

In the prior art, the internal slew rate of the operational amplifier is generally enhanced by increasing the bias current $IT_1$ of the amplification stage circuit. However, this not only increases circuit area, e.g. by increasing layout area of the bias transistors, but also causes additional power consumption of the operational amplifier. Thus, an import issue for circuit designers in this art is how to increase the slew rate of the operational amplifier without increasing power consumption.

SUMMARY OF THE INVENTION

It is therefore an objective of the present invention to provide an operational amplifier and related method capable of enhancing slew rate.

According to the present invention, an operational amplifier capable of enhancing slew rate is disclosed. The operational amplifier includes a first current generator for generating a first bias current; a second current generator for generating a second bias current; an amplification stage circuit for generating an amplification signal according to an input signal; an output stage circuit, coupled to the amplification stage circuit, for generating an output signal according to the amplification signal, and a bias current allocation unit, coupled to the first current generator, the second current generator, the amplification stage circuit and the output stage circuit, for reallocating current intensities of the first bias current and the second bias current to enhance the slew rate of the operational amplifier according to a control signal.

According to the present invention, a method capable of enhancing slew rate of an operational amplifier is further disclosed. The operational amplifier includes an amplification stage circuit and an output stage circuit. The method includes steps of generating a first bias current to the amplification stage circuit; generating a second bias current to the output stage circuit; and reallocating current intensities of the first bias current and the second bias current for enhancing the slew rate of the operational amplifier according to a control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
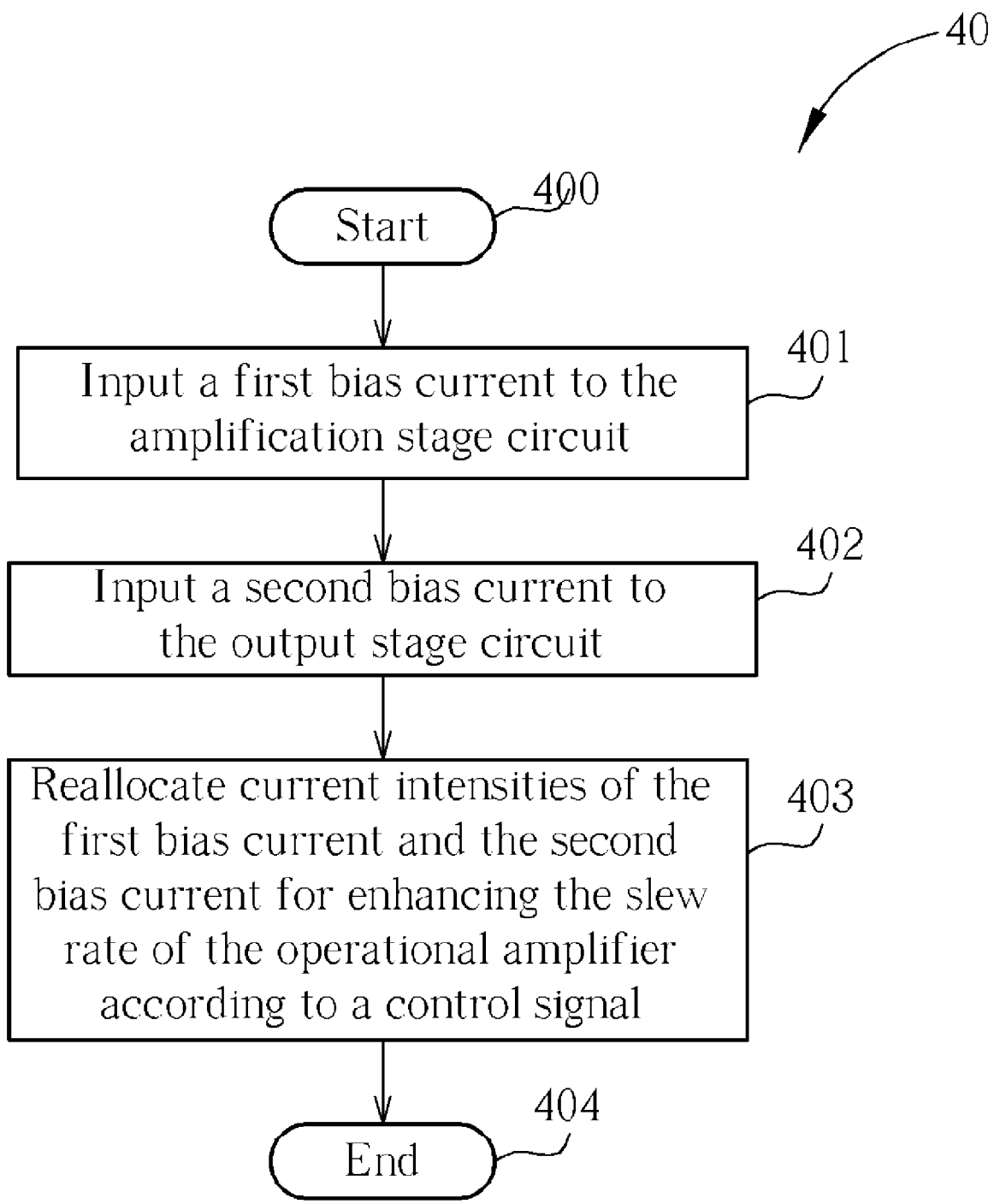
FIG. 4 is a schematic diagram of a process capable of enhancing slew rate of an operational amplifier according to an embodiment of the present invention.

Please refer to FIG. 4. FIG. 4 is a schematic diagram of a process 40 for enhancing slew rate of an operational amplifier according to an embodiment of the present invention. Generally, the operational amplifier includes an amplification stage circuit and an output stage circuit. The amplification stage circuit is utilized for increasing current or voltage gain of the operational amplifier, and the output stage circuit is utilized for driving capacitive or resistive loads connected to the operational amplifier. The process 40 includes the following steps:

Step 400: Start.

Step 410: Input a first bias current to the amplification stage circuit.

Step 420: Input a second bias current to the output stage circuit.

Step 430: Reallocate current intensities of the first bias current and the second bias current for enhancing the slew rate of the operational amplifier according to a control signal.

Step 440: End.

According to the process 40, the first bias current and the second bias current are respectively generated as static currents (or drive currents) of the amplification stage circuit and the output stage circuit. Then, the current intensities of the first bias current and the second bias current are reallocated for enhancing the slew rate of the operational amplifier according to the control signal in the present invention. Preferably, the control signal can be generated before the operational amplifier receives an input signal, before transition of the input signal occurs, or during the transition of the input signal.

In other words, before the operational amplifier receives the input signal or before the transition of the input signal occurs, the current intensities of the amplification stage bias current and the output stage drive current are reallocated to increase the bias current of the amplification stage circuit, so as to enhance internal drive capability of the operational amplifier. In this case, without increasing power consumption, the slew rate of the operational amplifier can be enhanced.

Figure 1:
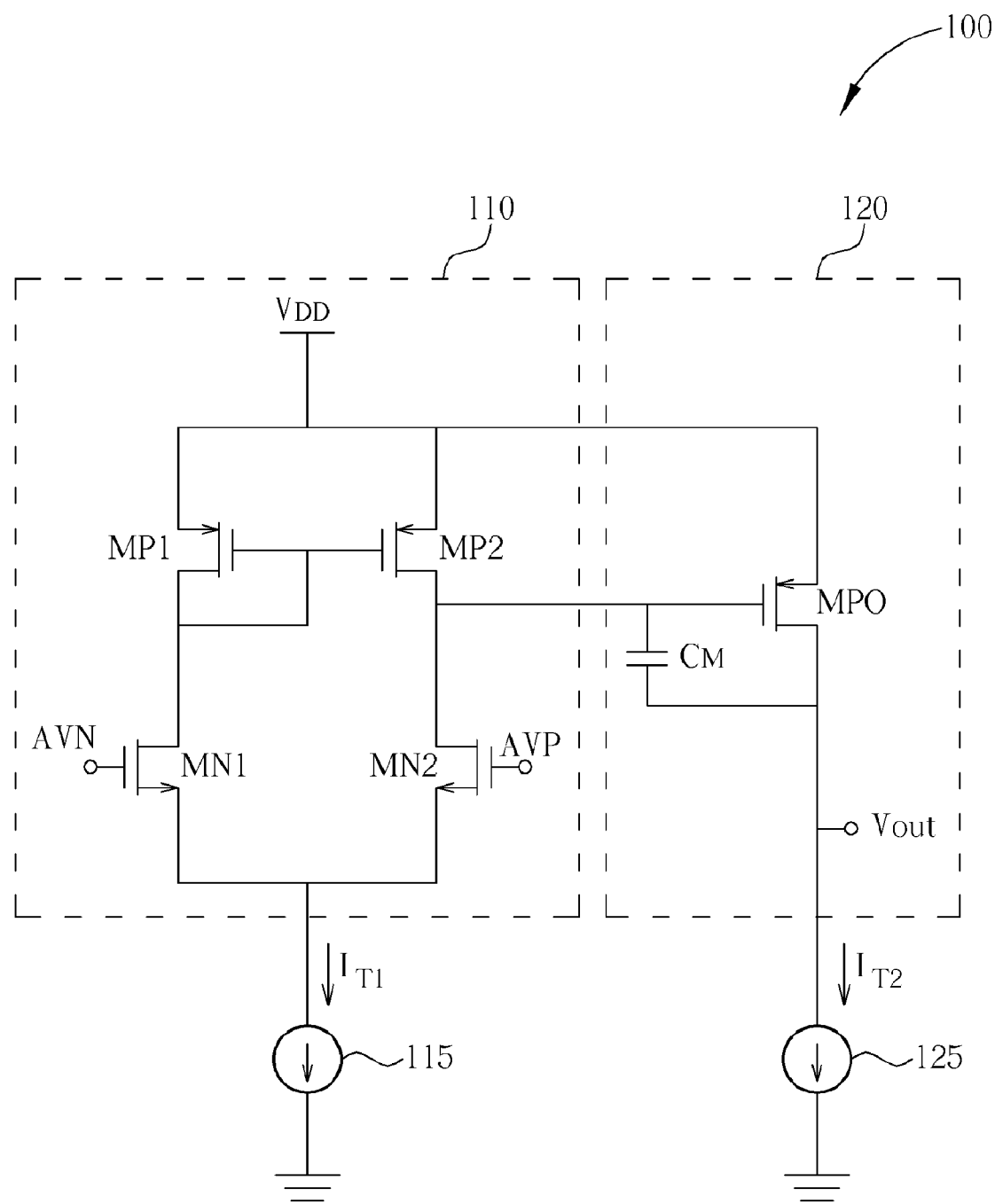
FIG. 1 is a schematic diagram of a conventional operational amplifier.
Figure 2:
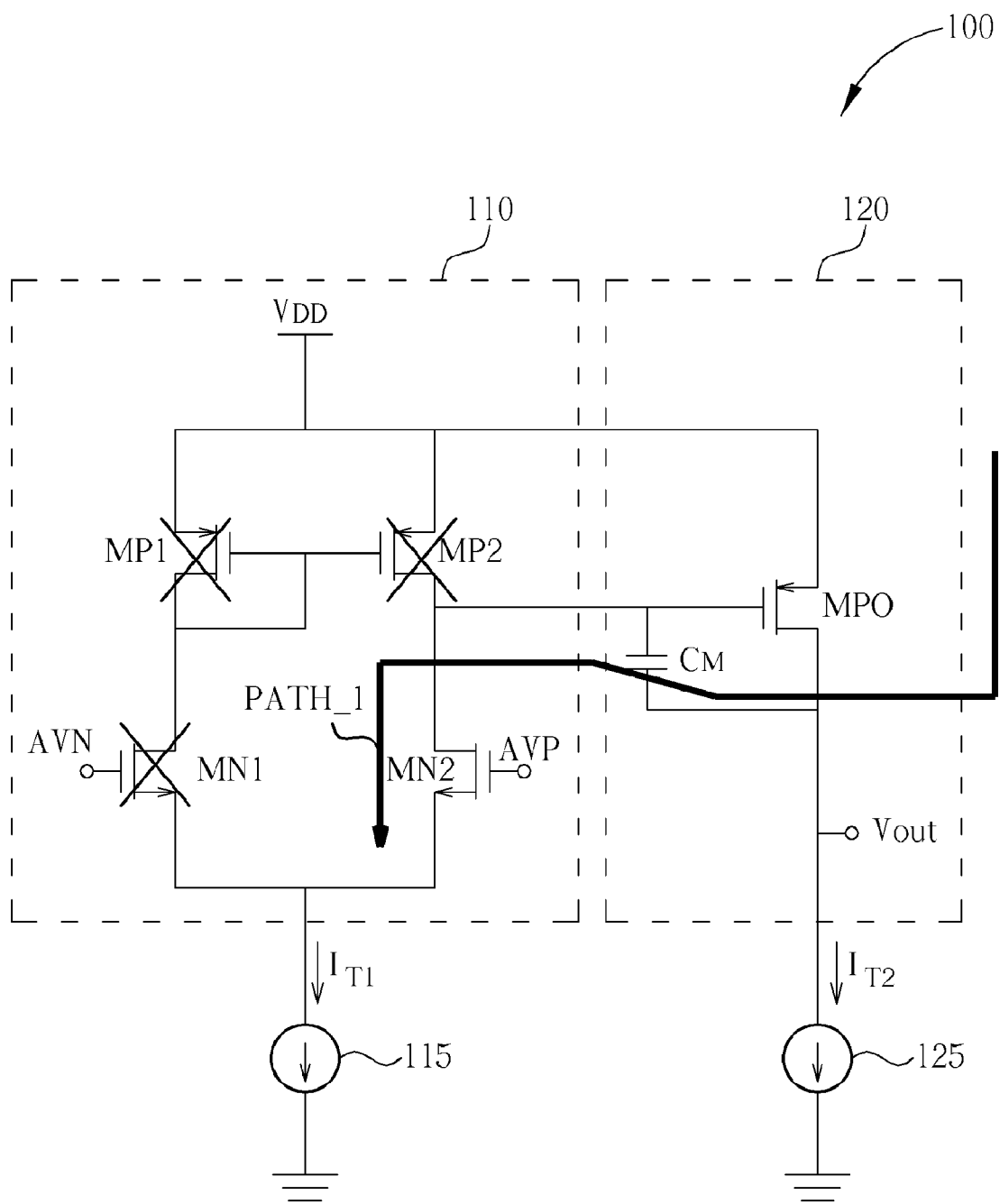
FIG. 2 illustrates an internal current path of the operational amplifier in FIG. 1 when an input signal is converted from low to high.
Figure 3:
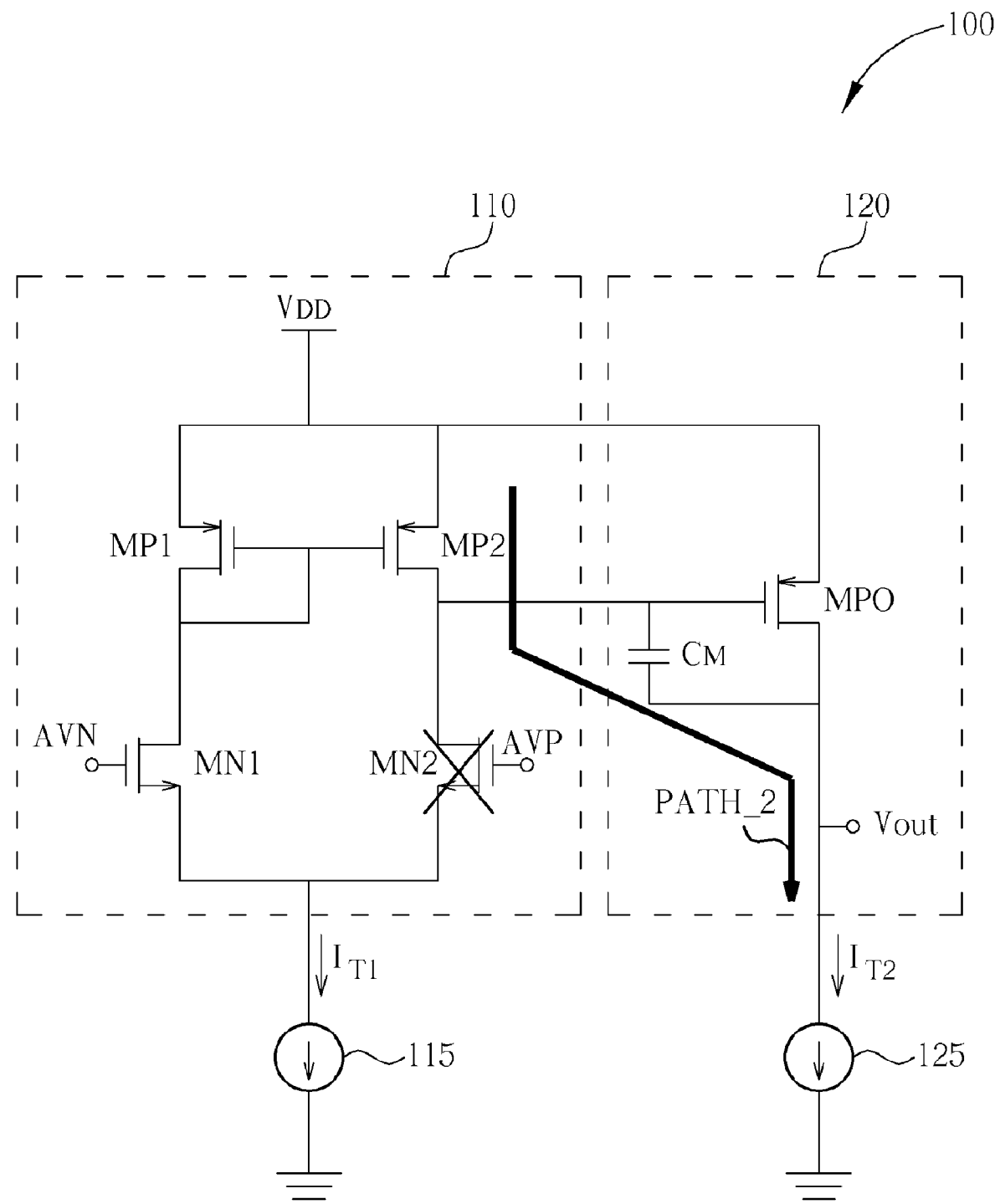
FIG. 3 illustrates an internal current path of the operational amplifier in FIG. 1 when an input signal is converted from high to low.
Figure 5:
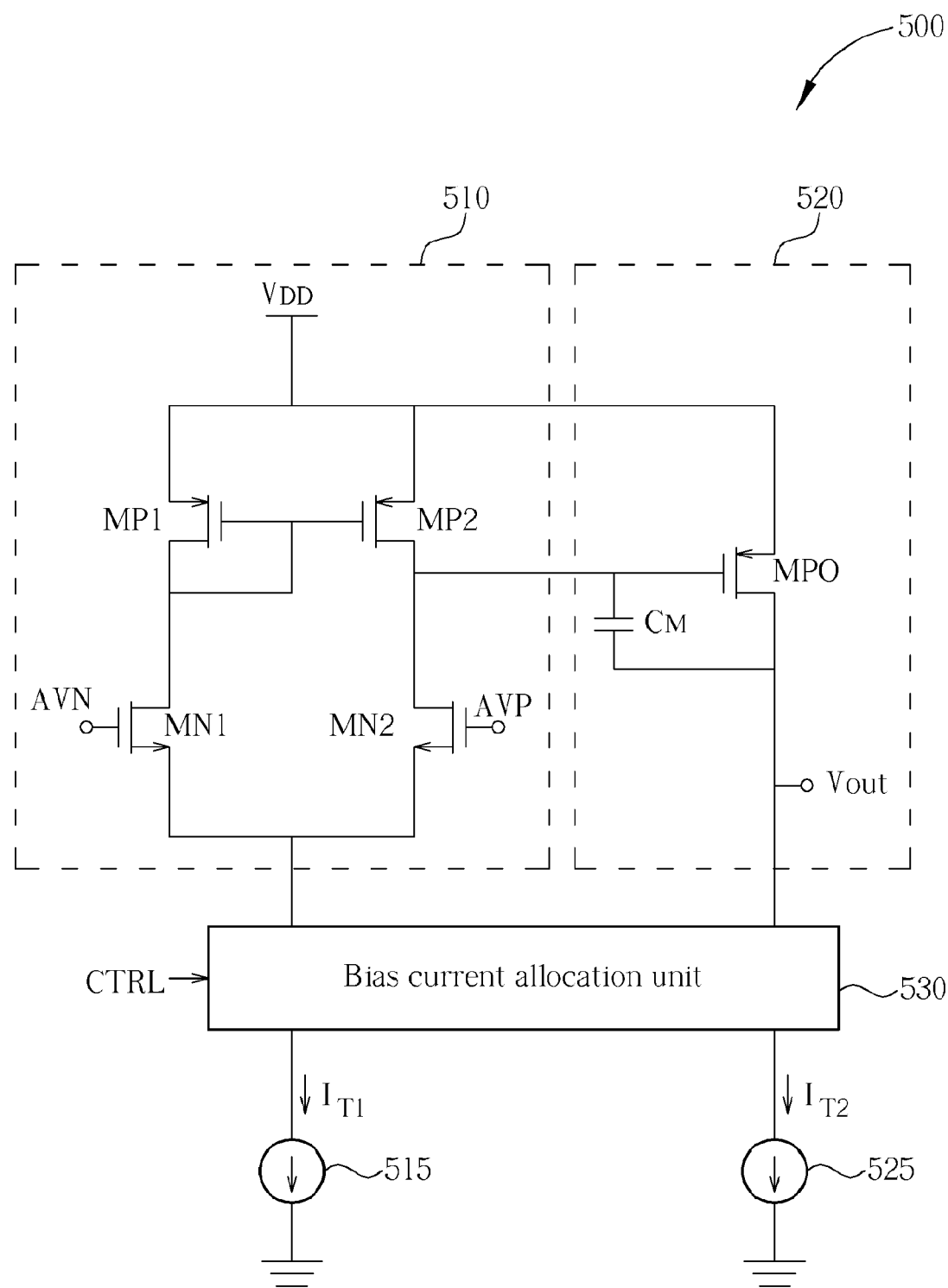
FIG. 5 is a schematic diagram of an operational amplifier capable of enhancing slew rate according to an embodiment of the present invention.

Please refer to FIG. 5. FIG. 5 is a schematic diagram of an operational amplifier 500 capable of enhancing slew rate according to an embodiment of the present invention. The operational amplifier 500 is utilized for realizing the process 40 of the present invention, and includes an amplification stage circuit 510, an output stage circuit 520, a first current generator 515, a second current generator 525 and a bias current allocation unit 530. The amplification stage circuit 510 is formed by transistors MP1, MP2, MN1 and MN2, and is utilized for generating an amplification signal according to an input signal received by an input terminal AVP. The output stage circuit 520 is formed by a transistor MPO that has a common emitter configuration, and is utilized for generating an output signal through an output terminal Vout according to the amplification signal. The first current generator 515 and the second current generator 525 are utilized for generating a first bias current $IT_1$ and a second bias current $IT_2$ to drive the amplification stage circuit 510 and the output stage circuit 520, respectively. Furthermore, the output terminal Vout of the output stage circuit 520 is further coupled to an input terminal AVN of the amplification stage circuit 510 for forming an output buffer with unit gain and negative feedback. In addition, a compensation capacitor $C_M$ is coupled between an output terminal of the amplification stage circuit 510, i.e. a drain of the transistor MN2, and the output terminal Vout of the output stage circuit 520, and is utilized for performing frequency compensation for output signals of the amplification stage circuit 510 and the output stage circuit 520 to enhance loop stability. Detailed operation of the operational amplifier 500 is similar to the operational amplifier 100 in FIG. 1, and not narrated again herein.

The bias current allocation unit 530 is coupled to the first current generator 515, the second current generator 525, the amplification stage circuit 510 and the output stage circuit 520, and is utilized for reallocating current intensities of the first bias current $IT_1$ and the second bias current $IT_2$ to enhance the slew rate of the operational amplifier according to a control signal CTRL. Preferably, the control signal CTRL is generated before the input signal is received by the operational amplifier 500 or before the transition of the input signal occurs.

Therefore, before the operational amplifier 500 receives the input signal or before the transition of the input signal occurs, the current intensities of the amplification stage bias current and the output stage drive current are reallocated to increase the bias current of the amplification stage circuit 510 for increasing charging or discharging speed of the compensation capacitor $C_M$, so that the response speed of the operational amplifier can be enhanced. In this case, without increasing power consumption, the slew rate of the operational amplifier can be enhanced as well.

For example, in the embodiment of the present invention, the bias current of the amplification stage circuit can be increased by switching a ratio of the output stage drive current to the amplification stage circuit, exchanging the amplification stage bias current with the output stage drive current, exchanging the amplification stage bias current with a ratio of the output stage drive current, and so on, for enhancing the slew rate of the operational amplifier.

Figure 6:
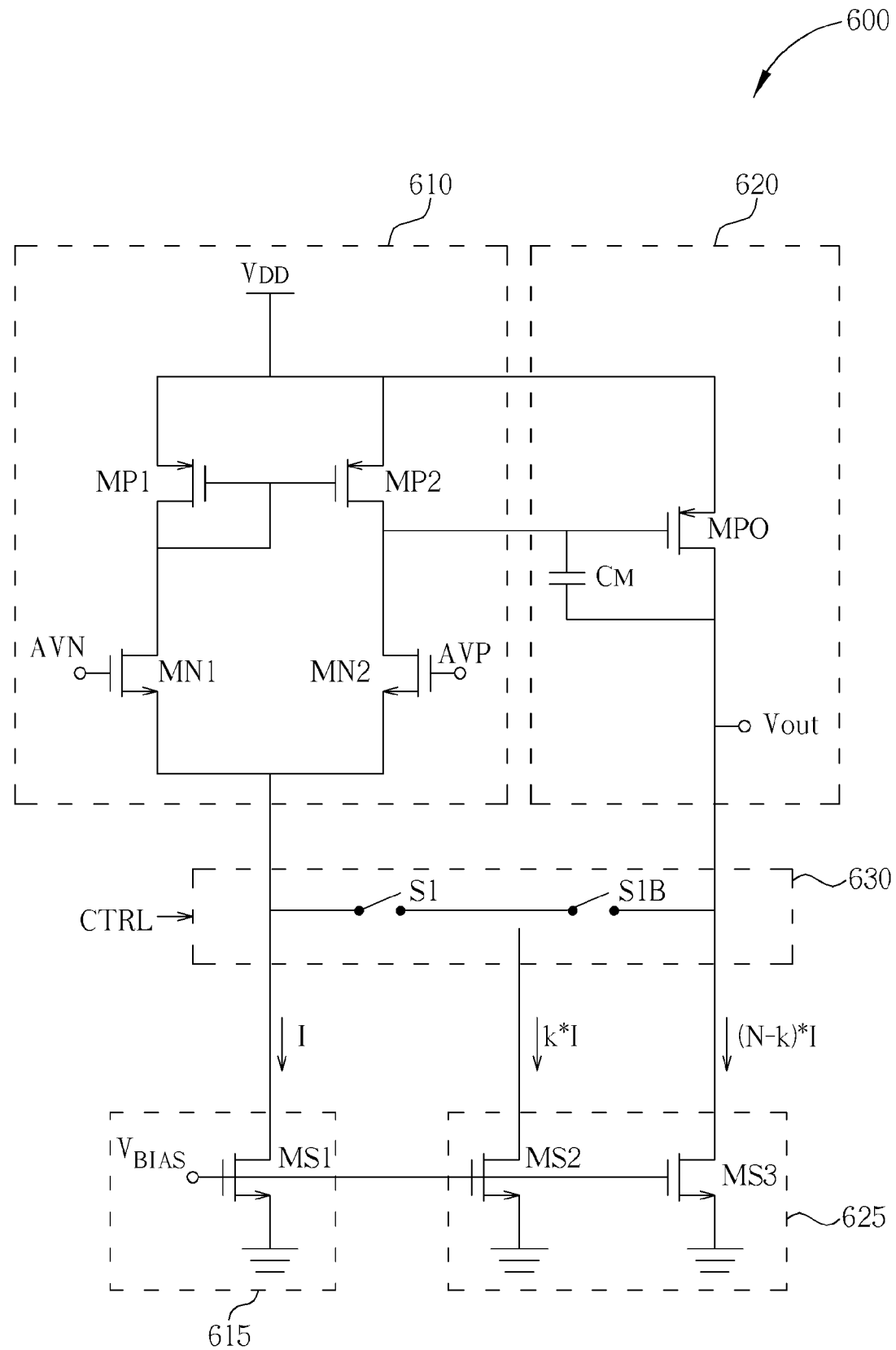
FIG. 6 is a schematic diagram of an operational amplifier according to a first embodiment of the present invention.

Please refer to FIG. 6. FIG. 6 is a schematic diagram of an operational amplifier 600 according to a first embodiment of the present invention. The operational amplifier 600 is an exemplary embodiment of the operational amplifier 500, and includes an amplification stage circuit 610, an output stage circuit 620, a first current generator 615, a second current generator 625 and a bias current allocation unit 630. The first current generator 615 includes a bias transistor MS1, which is utilized for generating a current intensity I to form the first bias current $IT_1$ according to a fixed bias voltage $V_{BIAS}$. The second current generator 625 includes two parallel bias transistors MS2 and MS3, which are utilized for generating current intensities K*I and (N−K)*I to form the second bias current $IT_2$ according to the fixed bias voltage $V_{BIAS}$, respectively. Apparently, the second bias current $IT_2$ is N times the current intensity of the first bias current $IT_1$. The bias current allocation unit 630 includes switches S1 and S1B, which are shorted alternatively according to opposite phases of the control signal CTRL, for switching a specific ratio of the second bias current $IT_1$, i.e. the current intensity K*I, to the amplification stage circuit 610, so as to increase the bias current of the amplification stage circuit 610.

Thus, before the operational amplifier 600 receives the input signal or before the transition of the input signal occurs, some of the output stage drive current is switched to the amplification stage circuit 610 for enhancing drive capability of the amplification stage circuit 610. Accordingly, when a voltage level of the input signal is converted, the compensation capacitor $C_M$ can be rapidly charged or discharged by the increased bias current $IT_1$ of the amplification stage circuit 610, so the response speed of the operational amplifier 600 can be enhanced. In this case, the slew rate of the operational amplifier 600 can be expressed by the following equation:

$$SR = \frac{I_{T1}}{C_M} = \frac{(1+K) \times I}{C_M} = \frac{\Delta V'}{t}.$$

Apparently, with the increase of the bias current $IT_1$, the slew rate of the operational amplifier is increased as well.

In addition, since the bias current of the amplification stage circuit 610 is increased by drawing some of the output stage bias current, the slew rate of the operational amplifier can thus be enhanced without additional power consumption. Certainly, after the voltage level of the output terminal comes up with that of the input terminal, the amplification stage bias current and the output stage drive current can be restored to their initial states, so that the large output stage bias current can be used to drive external loads of the operational amplifier 600.

Note that the first current generator 615 and the second current generator 625 can be realized by any current sources capable of generating fixed current intensities, and are not restricted in the above-mentioned transistors.

Figure 7:
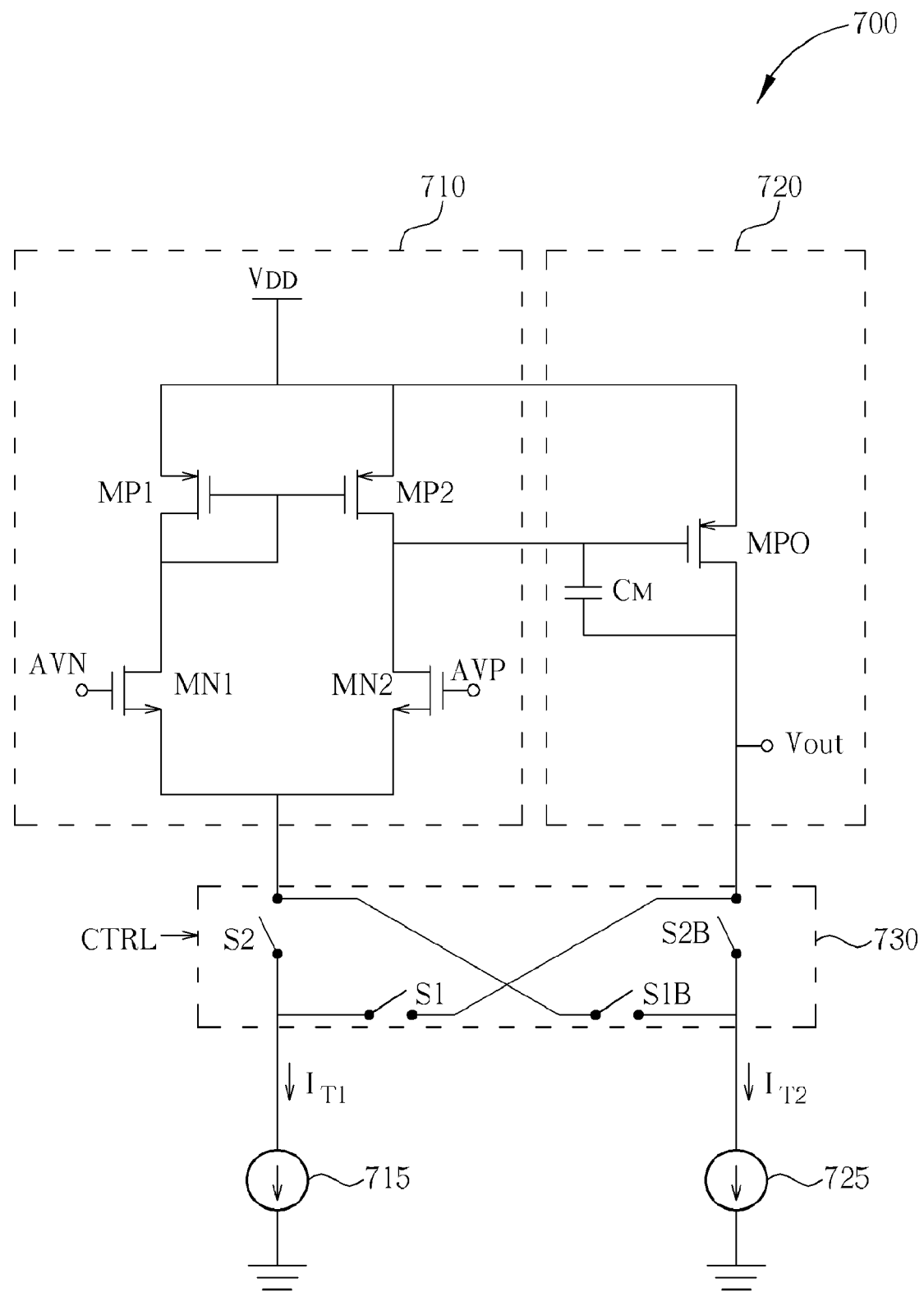
FIG. 7 is a schematic diagram of an operational amplifier according to a second embodiment of the present invention.

Please further refer to FIG. 7. FIG. 7 is a schematic diagram of an operational amplifier 700 according to a second embodiment of the present invention. The operational amplifier 700 is another exemplary embodiment of the operational amplifier 500, and includes an amplification stage circuit 710, an output stage circuit 720, a first current generator 715, a second current generator 725 and a bias current allocation unit 730. The first current generator 715 and the second current generator 725 are utilized for generating a first bias current $IT_1$ and a second bias current $IT_2$ to drive the amplification stage circuit 710 and the output stage circuit 720, respectively. The bias current allocation unit 730 includes switches S1, S1B, S2 and S2B. The switches S1, S2 and the switches S1B, S2B are shorted alternately according to opposite phases of the control signal CTRL, and are utilized for exchanging to output the first bias current $IT_1$ and the second bias current $IT_2$ to the output stage circuit 720 and the amplification stage circuit 710.

Since the output stage bias current $IT_2$ is generally greater than the amplification stage bias current $IT_1$, the drive capability of the amplification stage circuit 710 can be further increased by exchanging the amplification stage bias current $IT_1$ and the output stage bias current $IT_2$, so as to increase charging or discharging speed of the compensation capacitor $C_M$. Similarly, in this embodiment, the slew rate of the operational amplifier can also be enhanced without increasing power consumption.

Figure 8:
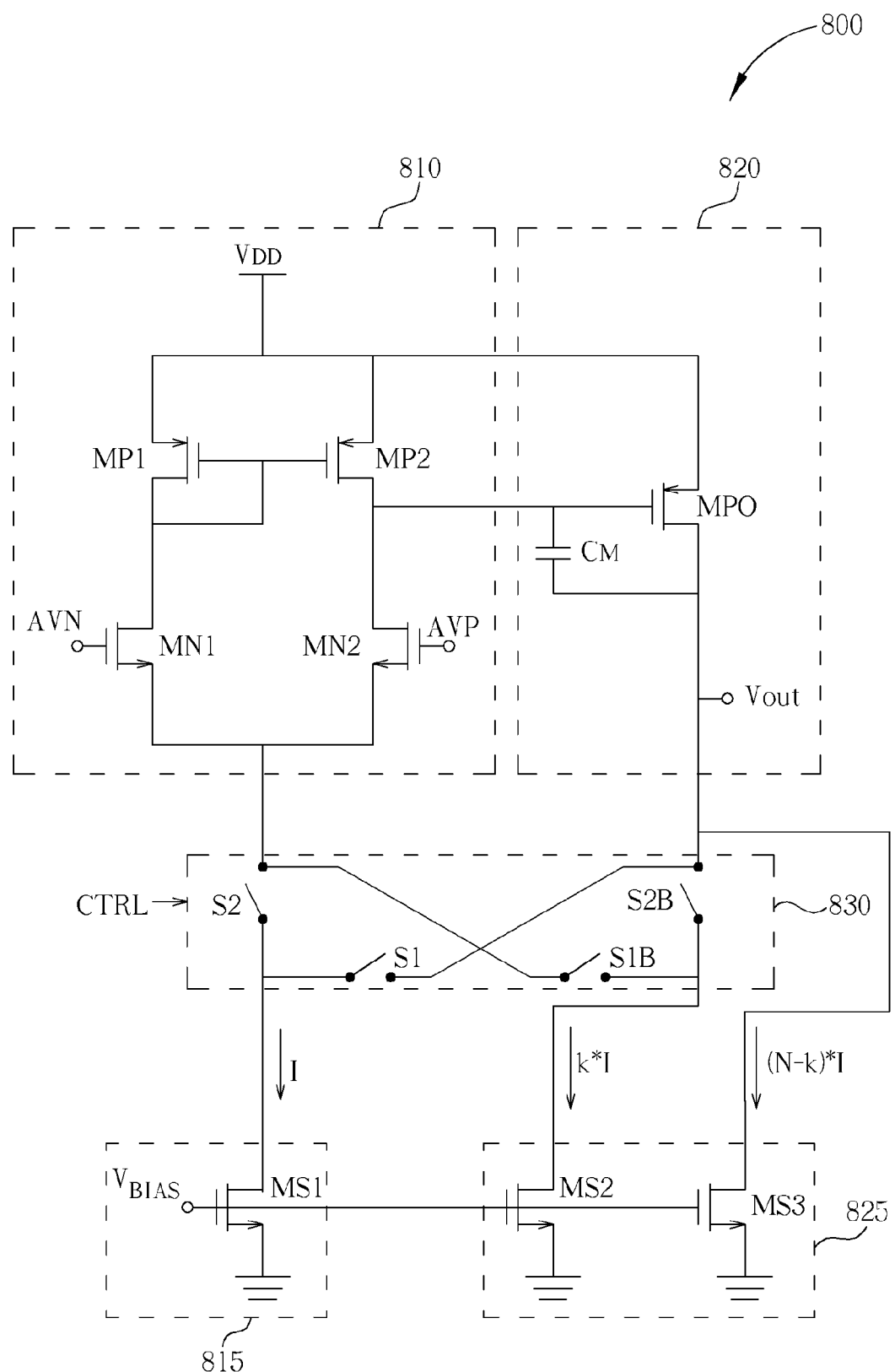
FIG. 8 is a schematic diagram of an operational amplifier according to a third embodiment of the present invention.

Note that the above embodiments are merely exemplary illustrations of the present invention but not limitations, such that those skilled in the art can certainly make appropriate modifications according to practical demands. For example, please refer to FIG. 8. FIG. 8 is a schematic diagram of an operational amplifier 800 according to a third embodiment of the present invention. The operational amplifier 800 can be considered a combination of the embodiments in FIG. 6 and FIG. 7, and exchanges a ratio of the output stage bias current, i.e. the current intensity K*I generated by the bias transistor MS2, with the amplification stage bias current in order to achieve the purpose of enhancing the slew rate of the operational amplifier. Such corresponding variation also belongs to the scope of the present invention.

Additionally, in other embodiments of the present invention, modifications like realizing the operational amplifier by P-type differential pairs or realizing the bias current allocation unit by a transmission gate can also be made, and are not restricted herein. Preferably, the operational amplifier can be applied in a driving circuit of a liquid crystal display (LCD) for enhancing response speed of the driving circuit, so as to satisfy increasing demands in large size and high resolution LCDs.

As mentioned above, before the operational amplifier receives the input signal, and before or during the transition of the input signal occurs, the current intensities of the amplification stage bias current and the output stage drive current may be reallocated to enhance the drive capability of the amplification stage circuit, so as to increase the response speed of the operational amplifier. In this case, the slew rate of the operational amplifier can be enhanced without increasing power consumption.

Those skilled in the art will readily observe that numerous modifications and alterations of the device and method may be made while retaining the teachings of the invention.

What is claimed is:

1. An operational amplifier capable of enhancing slew rate comprising:
   a first current generator for generating a first bias current;
   a second current generator for generating a second bias current;

an amplification stage circuit for generating an amplification signal according to an input signal;

an output stage circuit, coupled to the amplification stage circuit, for generating an output signal according to the amplification signal; and a bias current allocation unit, coupled to the first current generator, the second current generator, the amplification stage circuit and the output stage circuit, for reallocating current intensities of the first bias current and the second bias current to enhance the slew rate of the operational amplifier according to a control signal.

2. The operational amplifier of claim 1 further comprising a compensation capacitor, coupled between output terminals of the amplification stage circuit and the output stage circuit, for enhancing loop stability.

3. The operational amplifier of claim 1, wherein the current intensity of the second bias current is greater than that of the first bias current.

4. The operational amplifier of claim 1, wherein a total current intensity of the first bias current and the second bias current is a fixed value.

5. The operational amplifier of claim 1, wherein the control signal is generated before the input signal is received by the operational amplifier.

6. The operational amplifier of claim 1, wherein the control signal is generated before a transition of the input signal occurs or during a transition of the input signal.

7. The operational amplifier of claim 1, wherein the bias current allocation unit switches a ratio of the second bias current to the amplification stage circuit for reallocating the current intensities of the first bias current and the second bias current.

8. The operational amplifier of claim 7, wherein the second bias current generator comprises a plurality of transistors, coupled in parallel to the output stage circuit, for generating the second bias current.

9. The operational amplifier of claim 8, wherein the bias current allocation unit switches a specific quantity of the plurality of transistors to couple to the amplification stage circuit according to the control signal.

10. The operational amplifier of claim 1, wherein the bias current allocation unit exchanges to output the first bias current and the second bias current to the output stage circuit and the amplification stage circuit for reallocating the current intensities of the first bias current and the second bias current.

11. The operational amplifier of claim 10, wherein the bias current allocation unit exchanges to couple the first current generator and the second current generator to the output stage circuit and the amplification stage circuit according to the control signal.

12. The operational amplifier of claim 1, wherein the bias current allocation unit exchanges to output the first bias current and a ratio of the second bias current to the output stage circuit and the amplification stage circuit for reallocating the current intensities of the first bias current and the second bias current.

13. The operational amplifier of claim 1, wherein the operational amplifier is an output buffer in a driving circuit of a liquid crystal display.

14. A method of enhancing slew rate of an operational amplifier, the operational amplifier comprising an amplification stage circuit and an output stage circuit, the method comprising:

inputting a first bias current to the amplification stage circuit;

inputting a second bias current to the output stage circuit; and reallocating current intensities of the first bias current and the second bias current for enhancing the slew rate of the operational amplifier according to a control signal.

15. The method of claim 14, wherein the current intensity of the second bias current is greater than that of the first bias current.

16. The method of claim 14, wherein a total current intensity of the first bias current and the second bias current is a fixed value.

17. The method of claim 14 further comprising:
generating the control signal before an input signal is received by the operational amplifier.

18. The method of claim 14 further comprising:
generating the control signal before or during transition of an input signal received by the operational amplifier.

19. The method of claim 14, wherein the step of reallocating the current intensities of the first bias current and the second bias current according to the control signal comprises:
switching a ratio of the second bias current to the amplification stage circuit according to the control signal.

20. The method of claim 14, wherein the step of reallocating the current intensities of the first bias current and the second bias current according to the control signal comprises:
exchanging to output the first bias current and the second bias current to the output stage circuit and the amplification stage circuit according to the control signal.

21. The method of claim 14, wherein the step of reallocating the current intensities of the first bias current and the second bias current according to the control signal comprises:
exchanging to output the first bias current and a ratio of the second bias current to the output stage circuit and the amplification stage circuit according to the control signal.

22. The method of claim 14, wherein the operational amplifier is an output buffer in a driving circuit of a liquid crystal display.

* * * * *